United States Patent [19]
Shimer et al.

[11] Patent Number: 5,566,060
[45] Date of Patent: Oct. 15, 1996

[54] E-BEAM HIGH VOLTAGE SWITCHING POWER SUPPLY

[75] Inventors: Daniel W. Shimer, Danville; Arnold C. Lange, Livermore, both of Calif.

[73] Assignee: The United States of America as represented by the Department of Energy, Washington, D.C.

[21] Appl. No.: 445,826

[22] Filed: May 22, 1995

Related U.S. Application Data

[62] Division of Ser. No. 867,639, Apr. 13, 1992, Pat. No. 5,418,707.

[51] Int. Cl.$^6$ ................................................. H02M 7/537
[52] U.S. Cl. ............................ 363/65; 363/95; 363/132; 307/58
[58] Field of Search .......................... 363/65, 40, 79, 363/95, 132; 307/43, 58, 82

[56] References Cited

U.S. PATENT DOCUMENTS

| | | | |
|---|---|---|---|
| 4,417,197 | 11/1983 | Schwarz | 323/272 |
| 4,814,965 | 3/1989 | Petersen | 363/65 |
| 5,019,952 | 5/1991 | Smolenski et al. | 363/16 |
| 5,272,612 | 12/1993 | Harada et al. | 363/8 |

*Primary Examiner*—Peter S. Wong
*Assistant Examiner*—Adolf Berhane
*Attorney, Agent, or Firm*—Miguel A. Valdes; William C. Daubenspeck; William R. Moser

[57] ABSTRACT

A high-power power supply produces a controllable, constant high voltage output under varying and arcing loads. The power supply includes a voltage regulator, an inductor, an inverter for producing a high frequency square wave current of alternating polarity, an improved inverter voltage clamping circuit, a step up transformer, an output rectifier for producing a dc voltage at the output of each module, and a current sensor for sensing output current. The power supply also provides dynamic response to varying loads by controlling the voltage regulator duty cycle and circuitry is provided for sensing incipient arc currents at the output of the power supply to simultaneously decouple the power supply circuitry from the arcing load. The power supply includes a plurality of discrete switching type dc—dc converter modules.

7 Claims, 4 Drawing Sheets

E-BEAM HIGH VOLTAGE SWITCHING POWER SUPPLY

The United States Government has rights in this invention pursuant to Contract No. W-7405-ENG-48 between the United States Department of Energy and the University of California for the operation of Lawrence Livermore National Laboratory.

This is a Division of U.S. application No. Ser. No. 07/867,639 filed Apr. 13, 1992 now U.S. Pat. No. 5,418,707.

BACKGROUND OF THE INVENTION

1. Field of the Invention

The field of the present invention generally relates to high power solid state power supplies. More particularly, the field of the present invention relates to a high power solid state power supply for producing a controllable, constant high voltage output under varying and arcing loads suitable for powering an ion source, such as an electron beam gun in a vacuum furnace, or an electron beam gun used in the vaporizer of a laser isotope separation system, or a plasma sputtering device or the like.

2. The Prior Art

An electron beam gun is used in a vacuum furnace system, or the like, for providing a high intensity beam of electrons to bombard a target material. The electron gun is typically disposed in an evacuated chamber together with the target material. The electron gun or E-beam gun usually includes a source of electrons, such as a heated cathode or filament, and a grounded accelerating anode. The cathode is maintained at a high negative potential with respect to the anode to establish a high electrostatic field for accelerating the electrons. A magnetic field may typically be provided for directing the electrons onto the target material.

During bombardment of the target material by the electron beam, various ionized materials are emitted. The presence of such materials often effects a substantial decrease in the voltage withstand capability between the various parts of the electron beam gun and other elements. This may result in arcing between the electron gun parts and other structures. Arcing causes a substantial increase in the electron gun current and may result in damage to the electron gun structure and surrounding elements. Arcing may also cause damage to the power circuitry driving the electron gun.

In high power and high performance applications, such as the vaporizer in a laser isotope separation system, physical spacing between the E-beam gun, surrounding components, and target materials is relatively small. As a result, the E-beam gun may arc to ground frequently. To avoid damage and to achieve long lifetimes, it is essential that the energy stored in the power supply output capacitance be small and that the so called power supply let through energy during arcing be small. In addition, the close physical spacing causes a greater chance for the electron beam to impinge on adjacent components and structures during steady, non-arcing operation. To avoid this, it is important that the power supply output voltage be accurately controllable with low ripple content.

Conventional thyristor controlled power supplies are inadequate for high power and high performance electron beam gun applications. Thyristor controlled power supplies generally operate at 60 Hz line frequency and generate significant output voltage ripple or require substantial output capacitance to reduce the ripple to acceptable levels. If gun arcs are frequent, the output capacitance may result in excessive accumulated energy discharge into the gun or surrounding components and result in a short lifetime. Thyristor controlled power supplies also have a relatively slow dynamic response which results in further energy let through to the gun during the arc and slow ramp up after the arc is extinguished. Thyristor controlled power supplies have a relatively poor input power factor and generate high input harmonics. This causes substantial cost increases in the 60 Hz utility power system in large power applications. Thyristor controlled power supplies are also physically large because the transformer and filter components operate at 60 Hz and the lower harmonics of 60 Hz. This is an important factor in capital equipment costs where large numbers of power supplies are used.

Conventional power supplies utilizing series pass tetrode vacuum tubes eliminate many of the deficiencies of the thyristor controlled power supply. The regulating characteristics of the tetrode vacuum tube can be used to produce very low output ripple voltages without requiring significant output capacitance. The regulating characteristics also permit a diode rectifier front end to be used which greatly raises the input power factor and reduces the input line harmonics. The current limiting tube characteristics, the high speed control capability of the tetrode grid, and the low output capacitance provide excellent response to gun arcs resulting in low energy into the gun and fast recovery after the arc extinguishes.

However, conventional tetrode vacuum tube E-beam power supplies have serious deficiencies of their own. The efficiency of this type of power supply is 80% or less compared to approximately 95% for thyristor controlled power supplies. This is because the tetrode must drop substantial voltage continuously for it to regulate properly. Tetrode vacuum tubes also wear out due to the filament breaking and to the chemical breakdown of the coating on the cathode which causes the cathode to lose its ability to emit electrons. As a result, the tetrode vacuum tube is a substantial maintenance expense item having to be replaced at least every 10,000 hours.

Power supplies which use switch-mode dc—dc converters operating at 10 kHz and above have the potential to eliminate the deficiencies of the conventional thyristor controlled and series-pass tetrode type power supplies. Power supplies which employ switch-mode dc—dc converters are compact because of smaller transformer and filter components, operate with a diode rectifier input for high input power factor, are efficient because they do not operate as linear regulators, require low maintenance because they are all solid state, and can have good dynamic response because they operate at high frequency.

One type of switching dc—dc converter useful for high power applications above 10 KHz with arcing loads is the series resonant type. Power supplies which use series resonant type dc—dc converters have an input rectifier and filter to produce a dc voltage, an inverter consisting of thyristors and a resonant network to produce high frequency current, transformer for producing the desired output voltage level, and a rectifier and filter to produce dc for application to the load. This is a well known type of power supply which has been applied to E-beam guns (U.S. Pat. No. 3,544,913, issued Dec. 1, 1970). The major deficiencies in this type of power supply for high performance E-beam applications are the amount of energy stored in the output filter capacitance and the inability to turn off power to the load until the resonant network reverses polarity. The output current of the inverter is sinusoidal and a substantial capacitance is required after rectification to obtain satisfactory output voltage ripple even though the inverter operates above 10 KHz. The dc—dc converter also continues to provide current to the load after an arc occurs until the resonant network commutates the thyristors. Although superior to the conventional 60 Hz thyristor type power supply with respect to energy dissipated into the gun during arcing, it is inferior to the series pass tetrode type power supply, and is not adequate for high performance power supplies for E-beam guns.

Another type of switching dc—dc converter useful for low power applications up to a few kilowatts and arcing loads is the current source, pulse-width-modulated type. This dc—dc converter consists of a voltage regulator, inductor, non-regulating inverter, transformer, output rectifier, and output filter capacitor as described in U.S. Pat. No. 3,737,755, issued Jun. 5, 1973. The inductor and inverter described in this referenced patent produce a square current waveform to the output rectifier and filter which allows a small output filter capacitance to be used and therefore low energy to the load during load arcs. However, the inverter voltage clamping means is inadequate for high power applications. This is because the inverter is relatively distant from the input filter capacitor in high power applications which results in substantial inductance in the clamping network and excessive voltage spikes across the inverter transistors.

As described above, problems exist with conventional power supplies and with switching power supplies for high power and high performance ion sources and specifically, electron beam guns. In summary, conventional thyristor power supplies have high output capacitance, slow dynamic response to arcing, and poor input power factor. Series pass tetrode regulator type power supplies have relatively low efficiency and substantial maintenance expense related to the vacuum tube. Both of these conventional types of power supplies are also physically large. Switching power supplies using series resonant type dc—dc converters solve many of the problems associated with conventional power supplies but still have excessive output capacitance and too slow a response to arcing. Switching power supplies using current source, pulse-width-modulated type dc—dc converters as described in the prior art potentially meet the E-beam gun power supply requirements but do not operate at high power levels.

Accordingly, it is an object of the present invention to provide an improved current source, pulse-width-modulated type dc—dc converter suitable for operation at 100 kW or more.

It is another object of the present invention to provide a power supply which is modular with one or more dc—dc converter modules of identical design rated at 100 kW or more used to achieve the required output power.

It is also an object of the present invention to provide a power supply which has tight voltage regulation and low output voltage ripple for precise beam control as well as small output capacitance for small energy into the load during load arcs.

A further object of the present invention is to provide a power supply which is current limited during an arc, which cuts back power to zero within a few micro-seconds or less after an arc is initiated, and which then ramps power back on in several milli-seconds after the cutback interval.

A still further object of the present invention is to provide a power supply which operates without excessive voltage transients or cable reflections with cable lengths between the power supply and the load of 100 feet or more during and after load arcing.

SUMMARY OF THE INVENTION

In accordance with the present invention, a solid state switching power supply is provided for converting a utility supplied ac input voltage into a high voltage dc output suitable for driving an electron gun for a high power and high performance application such as in an atomic vapor laser isotope separation process or the like. The present invention also may be useful for applications such as radar systems, which may behave as an arcing load.

The present power supply comprises an input diode rectifier and filter for converting the ac input voltage to an unregulated dc voltage. A plurality of switching type dc—dc converter modules, each rated at 100 kW or more, are connected with their inputs in parallel and their outputs in series and used to convert this unregulated dc voltage into a regulated high dc voltage output.

The dc—dc converter modules are an improved version of the well known current source, pulse-width-modulated type. Each converter consists of an input decoupling network, an input capacitor, a voltage regulator, a square wave inverter, a step up transformer, and an output rectifier and filter. The input decoupling network functions together with the input capacitor to eliminate interaction between modules and to prevent significant high frequency current in the cables from the input rectifier and filter. This feature permits parallel operation of the modules from one dc source. Insulated gate bipolar transistors (IGBTs) are used as the switches in the voltage regulator and inverter because of their high power capability and fast switching speeds. An improved inverter clamping network minimizes stray inductive loops and permits tight control of the inverter IGBT voltages during inverter output polarity transitions. Both of these features permit module operation with inverter switching frequencies of 10 kHz and above and output power levels of 100 kW and above.

Each dc—dc converter module has a control scheme to permit operation with widely varying and arcing loads. A feedback loop regulates the module output voltage by controlling the on/off ratio of the voltage regulator switches. A feedback signal representing the output voltage is generated using an output simulator circuit fed from a one turn sense winding on the step up transformer and a dc current sensor on the module output lead. This feature permits generation of a feedback signal at ground level, isolated from the high voltage, which reproduces the dynamics of the module output power circuitry and the e-beam gun load. The control scheme also blocks power flow to the load during arcing. Output currents above normal operating levels are detected by a comparator circuit which triggers a cutback timer circuit. This cutback timer simultaneously turns off both regulator switches and turns on all four inverter switches for a predetermined time interval. This feature permits rapid extinguishing of the arcing in the load.

The overall power supply output is formed by connecting the outputs of the modules in series and then connecting to an output decoupling network and a transmission line matching impedance before connecting to the transmission line to the load. The output decoupling network prevents the module output filter capacitors from shorting out the line matching impedance. This feature keeps overvoltage transients to a minimum at the power supply output and at the load during load arcing.

The overall power supply includes control circuitry for phasing the timing of the switching of the voltage regulator and inverter in each module with respect to adjacent modules by 360°/n for n total modules. This feature reduces the output capacitance needed to achieve a low output voltage ripple and therefore reduces the energy delivered to the load during load arcing. Circuitry is also included for controlling the power supply output voltage. An overall voltage feedback loop produces an error signal which serves as the voltage setpoint to the individual module feedback loops. A ramp generator controls the rate of rise of the output voltage during turn on and after cutbacks.

DETAILED DESCRIPTION

Figure 1A:
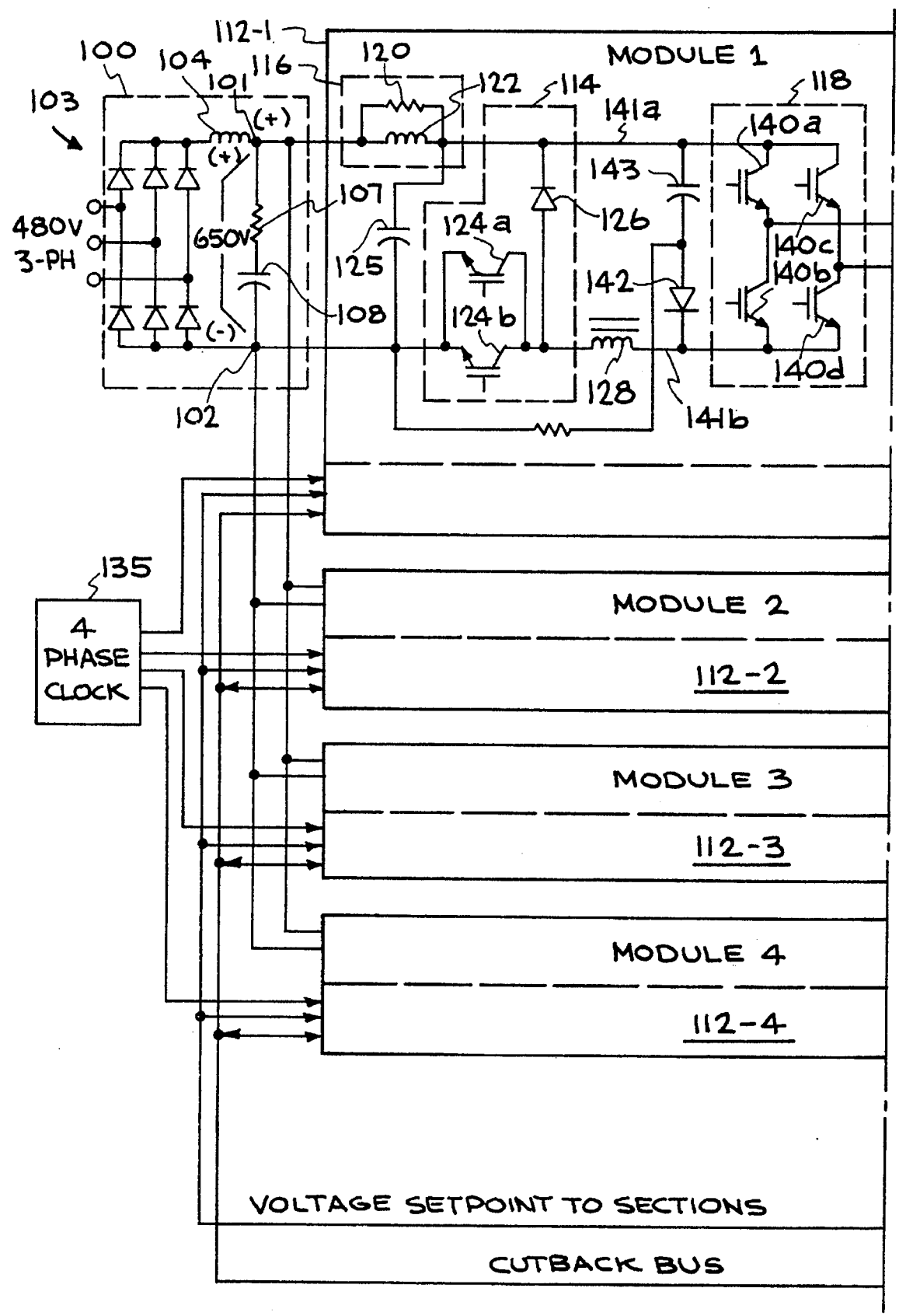
FIG. 1A and FIG. 1B together are an overall circuit diagram of the power supply in accordance with the present invention. It is shown with four dc—dc converter modules.
Figure 1B:
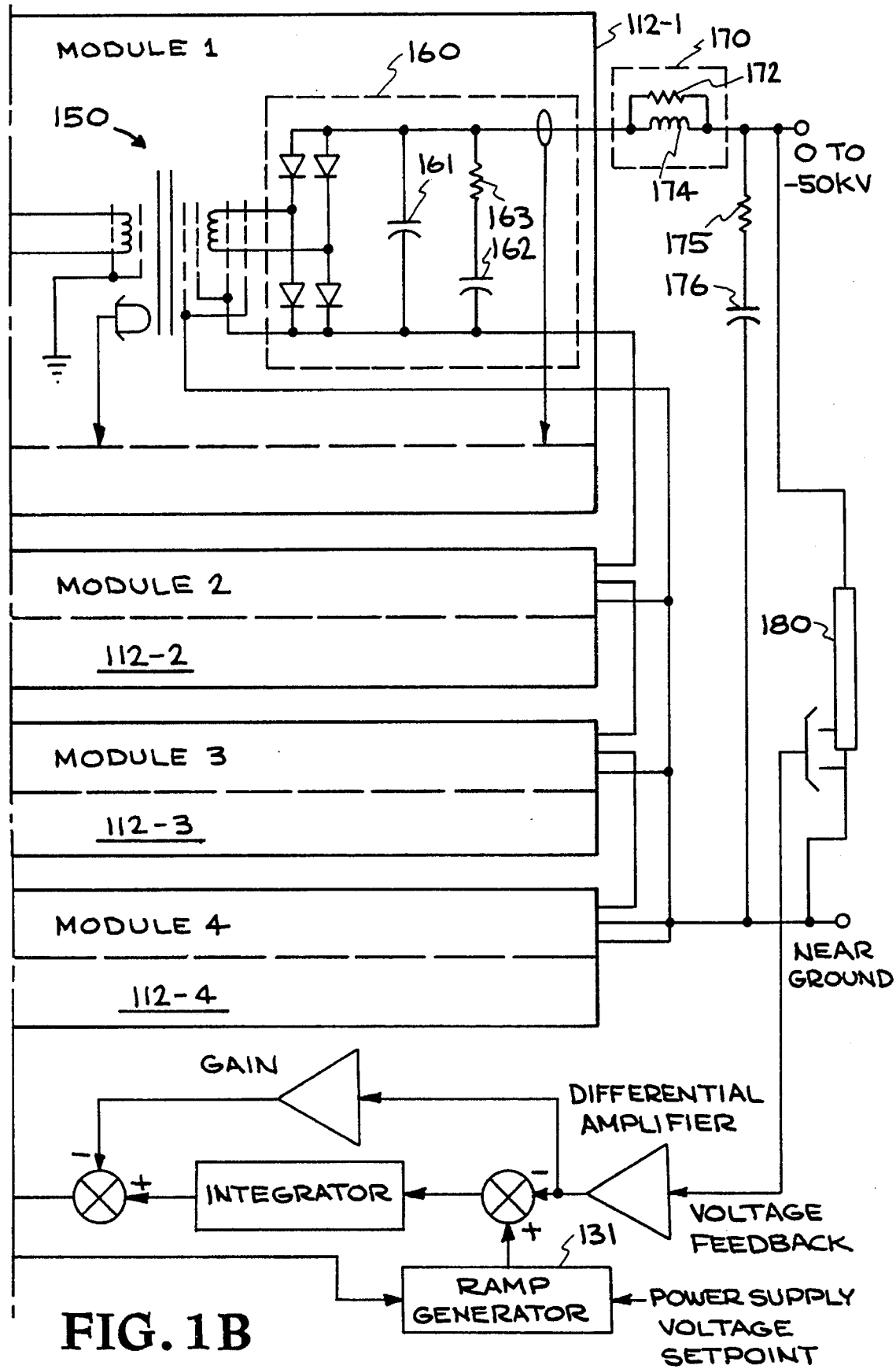

As shown in FIG. 1A and FIG. 1B (hereinafter jointly referred to as FIG. 1), an ac voltage, typically 480 volts, three phase, is applied to a rectifier/filter circuit 100. Rectifier/filter circuit 100 provides a means for converting the three phase ac input voltage to a filtered dc output voltage on positive node 101 and reference node 102, respectively. The rectifier/filter consists of six diodes 103 arranged in a full wave bridge circuit. The output of the full wave bridge circuit connects to inductor 104 to provide smoothing of the current ripple. The inductor 104 then connects to a series connected network formed by damping resistor 107 and filter capacitor 108. For an output rating of 400 kW, the inductor 104 is typically 500 microhenries (µH), the damping resistor 107 is typically 0.5 ohms, and the capacitor 108 is typically 8,000 microfarads (µF). The rectification of the ac voltage and the filtering of the voltage ripple are accomplished in a known manner.

In accordance with one aspect of the present power supply, a plurality of modular dc—dc converter circuits or modules 112-1, 112-2, 112-3, . . . 112-n, are connected in parallel to the output leads, nodes 101 and 102, respectively of the rectifier/filter 100. Each dc—dc converter module 112-1 through 112-n includes a voltage regulator circuit means 114 for producing a source of pulsating voltage of controlled duty cycle; an inductor 128 for converting the pulsating voltage into a direct current, an inverter circuit means 118 for generating a high frequency square wave of alternating polarity from said direct current, a transformer means 150 for isolation and step up of the inverter output, and an output rectifier/filter circuit means 160 for rectifying and filtering the high frequency square wave current to produce a high dc output voltage.

Each voltage regulator circuit 114 is associated with a corresponding decoupling network 116 and input capacitor 125. The decoupling network comprises a 0.25 ohm resistor 120 and a 40 microhenry (µH) inductor 122 connected in parallel and having a connection with the positive input lead 101 from the rectifier 100. The input capacitor 125 is typically 200 microfarads (µF) and one side connects to the node formed by the decoupling network and the positive inverter bus 141a. The other side of input capacitor 125 connects to the negative input lead 102 from the rectifier/filter 100. The decoupling network, inductor 122 and resistor 120, provides an impedance at high frequency which forces the current surges drawn by regulator 114 to pass through capacitor 125 and not through the rectifier/filter 100 or the parallel connected dc—dc converter modules.

Each voltage regulator circuit 114 comprises two insulated gate bipolar transistors (IGBTs) 124 in parallel having their emitters connected with the negative lead of input capacitor 125 and having their collectors connected with the anode of a free wheeling diode 126 and with a first lead of a 500 microhenry (µH) inductor 128, respectively. The present device is not limited to IGBTs. Any gate controlled switching means of suitable current and voltage ratings and switching speed may be used. For simplicity, such devices will be referred to as IGBTs. IGBTs 124a, 124b are activated alternately by control signals applied to their gates. Both IGBTs 124a and 124b are activated at 10 kHz but phase shifted 180° with respect to each other. This results in a net 20 kHz switching frequency for the pair. This technique eliminates current sharing difficulties which might occur if both IGBTs 124a and 124b were activated simultaneously. The activation of IGBTs 124a, 124b enable current to build up and to decay through inductor 128 in such a manner that the output voltage of the dc—dc converter module 112 is controlled. The activation of IGBTs 124a, 124b causes a rectangular dc voltage waveform of from 0 to 650 volts to appear across diode 126. The pulsating dc voltage from 0 to 650 volts across free wheeling diode 126 is smoothed out to a low ripple direct current by inductor 128. The above values stated for the decoupling network 116 components, input capacitor 125, and inductor 128 are for a 100 kW module output rating and for a switching frequency of 10 kHz for each voltage regulator IGBT 124a and 124b.

The dc output voltage from the voltage regulator 114 is passed through inductor 128 to produce a substantially smooth direct current which is then applied to an inverter means 118 for converting the dc to a high frequency square wave current of alternating polarity, that is, a high frequency ac. Current is supplied from the node formed by the input decoupling network 116 and input capacitor 125 to the inverter positive bus 141a and returned from the inverter negative bus 141b through inductor 128 to the voltage regulator 114. Inverter 118 comprises a plurality of insulated gate bipolar transistors (IGBTs) connected in series and configured in two branches which are in turn connected in parallel, forming a bridge circuit. Here also, any gate controlled switching means suitable for high current applications may be substituted for IGBTs. Preferably, four IGBTs 140 are used, two series connected IGBTs in each parallel branch, which are activated in diagonal pairs. There are two IGBTs for each ac line. It will be appreciated by those skilled in the art that two ac lines are needed to drive an associated single phase transformer.

The IGBTs 140 are activated in alternate, diagonal pairs by control signals applied to their enable leads in a manner well known to those skilled in the art, so as to produce a square wave of alternating polarity. The high frequency square wave current is applied through the primary winding of an associated transformer 150. The IGBTs are able to develop the needed high frequency power due to their high switching speeds, high current capability, and high breakdown voltage. The high frequency current through the primary is inductively coupled to the secondary of the transformer 150. A transformer 150 is part of each corresponding dc—dc converter module 112-1 through 124-n, and provides a means for stepping up the high frequency ac voltage applied to the primary in order to produce the high voltage needed for powering the electron gun. The transformer 150 also provides electrical isolation for the output of each dc—dc converter module which permits the outputs to be connected in series. The leads of the secondary of transformer 150 are then applied to an output rectifier/filter circuit means 160 for converting the high frequency alternating current to a smooth high dc voltage. The output rectifier/filter circuit 160 consists of a single phase, full wave bridge rectifier which connects to a parallel 0.05 microfarad capacitor 161 and a parallel damping network formed by a 2400 ohm resistor 163 in series with a 0.15 microfarad capacitor 162. The above values are for a four module power supply rated at 400 kW and 50 kV output with a ±0.5% peak to peak output voltage ripple, and each inverter operating at 10 kHz. The output rectifier/filter circuit means 160 operates in a well known manner.

Referring to FIG. 1, an output decoupling network 170 comprises a 100 ohm resistor 172 in parallel with a 500 microhenry (μH) inductor 174. One side of the output decoupling network 170 is connected to the high voltage side of the series connected dc—dc converter module outputs. The other side of the decoupling network is connected to the node formed by the high voltage transmission line to the load, the line matching network consisting of a 50 ohm resistor 175 and 0.01 microfarad capacitor 176 connected in series, and the high voltage side of the voltage feedback divider 180. For the sub-microsecond times in which a load-arc is initiated and transmission line reflections occur, the impedance of the decoupling network is much larger than the impedance of the line matching network. As a result, during arcing the transmission line is matched by its characteristic impedance and is not shorted out by the output filter capacitance of the dc—dc converter modules. This results in small over-voltage transients at the load and power supply. The typical component values listed above are for an output of 50 kV at 400 kW and with a transmission line length of 100 feet.

It will be apparent to those skilled in the art that the output decoupling network 170 can be divided evenly and distributed into each dc—dc converter module. The function of the decoupling network will not be changed. In some applications this is the preferred embodiment.

It will also be appreciated by those skilled in the art that the outputs of the dc—dc converters can be connected in parallel instead of in series. This requires the output decoupling network 170 to be placed in the output of each converter module to avoid interactions between the outputs of each module.

In accordance with the present device, the inverter IGBTs 140a, b, c, d have their on times synchronized with the on times of the IGBTs or switching means 124a, b of each voltage regulator circuit 114 in each dc—dc converter module 112. The transition of inverter output current polarity occurs when one diagonal IGBT pair in the inverter bridge turns off and the opposite diagonal IGBT pair conducts. This time occurs at the end of conduction of either IGBT 124a or 124b in the voltage regulator circuit. This synchronization permits the phasing of the modules described below to be realized.

It will be appreciated that the dc—dc converter modules, shown as sections 112-1, 112-2, 112-3, . . . 112-n in FIG. 1, comprise identical modular power supply circuits which are interchangeable. The inputs to each dc—dc converter module 112 are linked in parallel and the outputs are linked in series with an adjacent dc—dc converter module 112.

The IGBTs 124a, b of each voltage regulator circuit 114 and IGBTs 140a, b, c, d of inverter circuit 118 in each separate dc—dc converter circuit module 112-1 are switched on in a phased relationship with respect to an adjacent module 112-2 . . . 112-n. For a plurality of n modules, the phase relationship is equal to 360°/n.

In the case of four modular dc—dc converter sections as shown in FIG. 1, the activation of each section or module 112-1 . . . 112-4 precedes the activation of a successive module by 90°. A 4-phase oscillator 135 generates the clock pulses separated by 90° to the modules. The phased activation of the separate modules 112-1, 112-2, 112-3 and 112-4 results in a frequency of the overall power supply output voltage ripple which is four times higher than the frequency of the module output voltage ripple. This permits a four times lower value of capacitance for the output filter capacitors 161 and 162 than would be necessary without phased activation.

A feedback control circuit shown generally at 130 in FIG. 1, controls the output voltage of the overall power supply in accordance with well known techniques. An analog voltage is generated by control circuit 130 based on the difference between the desired output voltage, or power supply voltage setpoint, and the actual output voltage as measured by voltage divider 180. This analog voltage becomes the voltage setpoint to another feedback control circuit in each dc—dc converter module. As will be explained more fully with reference to FIG. 2, this module feedback control circuit generates an error voltage which depends on the difference between its setpoint and the derived output voltage of each module. This error voltage is converted in the module control circuit to an enable signal having a variable duty cycle as a function of the error voltage. This enable signal is then applied by the control circuit to the enable leads of the IGBT transistors 124a, b. The varying of the on and off times of IGBTs 124a, b maintains the output voltage from the dc—dc converter 112-1 at a controlled level under varying conditions of load.

A ramp generation circuit 131 is part of the overall power supply feedback control circuit 130. The ramp generator slows down the voltage setpoint applied to the feedback control summing means to avoid overshoots of the power supply output voltage. The ramp generator is needed during step increases in power supply voltage setpoint or after the end of the cutback interval which occurs because of load arcing. The ramp time is on the order of 10 ms for an output power rating of 400 kW.

Figure 2:
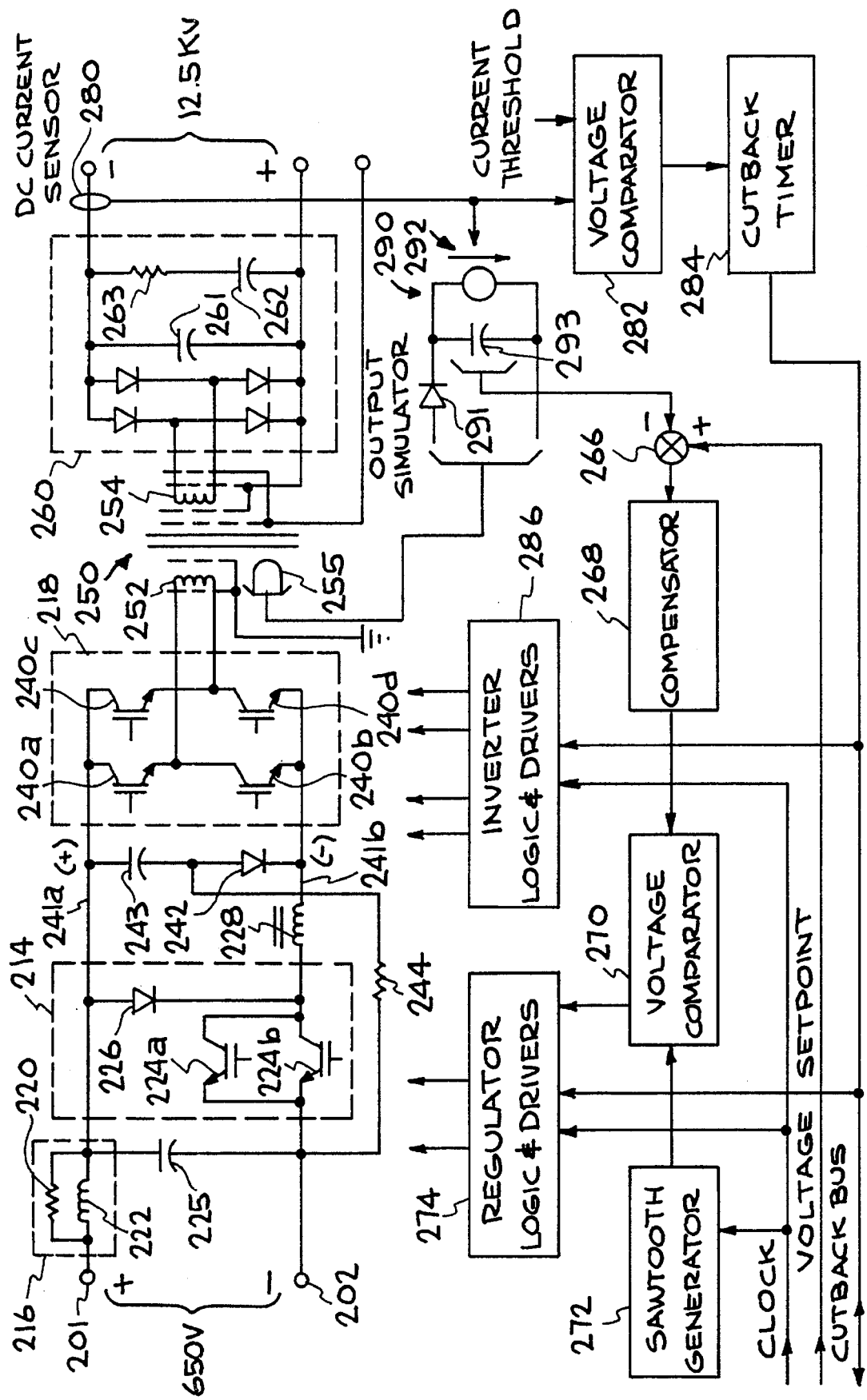
FIG. 2 is a circuit diagram of a single module.

The operation of a single modular section, for example, 112-1 is described with reference to FIG. 2. After rectification and filtering by the three phase input rectifier and filter 100 shown in FIG. 1, a dc voltage of 650 volts appears across input lines 201 and 202, respectively, as shown in FIG. 2. Lines 201 and 202 correspond to nodes 101 and 102, respectively of FIG. 1. An input decoupling circuit 216 comprises an inductor 222 in parallel with a resistor 220. The input decoupling circuit 216 provides a means for maintaining a substantially smooth current with low ripple from the output of the 650 volt source connected across nodes 201 and 202. The input decoupling circuit 216 also provides a means for preventing interactions between the modules 112 which are connected in parallel across the 650 volt source. The input decoupling circuit 216 presents a relatively high impedance compared to the impedance of the input capacitor 225 at the regulator switching frequency and above. As a result, it effectively forces the high frequency current pulses drawn by the regulator to flow from capacitor 225 and not from the input rectifier/filter 100 of FIG. 1. This substantially reduces electromagnetic interference caused by the power supply since the currents in the cables between the input rectifier/filter and the dc—dc converter modules are smooth with low ripple.

The input decoupling circuit 216 also damps out ringing. It will be appreciated that the input decoupling circuit 216 permits parallel operation of the modules. 112-1 . . . 112-4 of FIG. 1 without large interactions. The input decoupling circuit 216 provides a means for damping the resonance between cables and capacitors of different modules. The resistor 220 provides damping to the series resonant network formed by the inductance of the cables between modules and capacitance of the input capacitors in the different modules.

Inductor 222 is connected in parallel with the resistor 220 which provides a damping,means for suppressing oscillation in current in the two circuit input lines 201 and 202. The inductor 222 also provides a means for limiting the rate of change of the current. Inductor 222 has an input end and output end inserted in the circuit line from 201. A capacitor 225 provides a charge storage means connected across the two circuit lines 201 and 202 on the output side of the inductor 222 toward the switching means 224a, 224b. This configuration insures that the line current on the input end of the current rate of change limiting inductor increases at a small rate from a first value to a high value when the switching means 224a, 224b of the voltage regulator conduct current. The line current on the input end of the current rate of change limiting inductor 222 decreases back to a first level at a small rate when the switching means 224a, 224b of the regulator are nonconductive. The capacitor 225 absorbs all current flow through the current rate of change limiting inductor 222 when the switching means 224a, 224b are nonconductive. The capacitor 225 also adds to the current through the current rate of change limiting inductor 222 to meet the current requirements of the voltage regulator switching means when the switching means 224a, 224b are conducting.

Each dc—dc convertor module also includes a voltage regulator circuit means 214 for providing a pulsating voltage of controlled duty cycle from an unregulated dc input voltage on lines depending from nodes 201 and 202 respectively. The voltage regulator circuit means 214 includes a free wheeling diode 226, voltage regulator switching means 224a, 224b each having a control lead, and emitter lead connected to a first output terminal of the unregulated dc input voltage and having a collector lead connected to the anode of free wheeling diode 226. The cathode of free wheeling diode 226 is connected through the input decoupling network 216 to a second terminal of the unregulated dc input.

Inductor 228 acts as a means for smoothing current having a first end connected to the common node of the voltage regulator switching means 224a and 224b and to the anode of free wheeling diode 226. The inductor means 228 provides a means for filtering the pulsating voltage created by the switching means 224 and creates a smooth direct current for application to the inverter circuit means 218.

Referring to FIG. 2, the inverter circuit 218 provides a means for converting the direct current from inductor 228 into a high frequency square wave current in the primary 252 of transformer 250. The inverter circuit 218 in a preferred embodiment comprises first and second parallel circuit branches. The first circuit branch comprises IGBTs 240a and 240b, respectively, connected in series. A second branch comprises IGBTs 240c and 240d, connected in series. Both circuit branches are connected in parallel to form a bridge network. The IGBTs act as a switching means, each having a collector lead, a control lead and an emitter lead. The IGBTs 240a and 240c each have their collectors connected to the positive inverter bus 241a which supplies a source of direct current. The emitter leads of IGBTs 240b and 240d are each connected to the negative inverter bus 241b which returns the direct current to inductor 228.

Also connected in parallel with the inverter circuit 218 between positive bus 241a and negative bus 241b are the series connected capacitor 243 and diode 242 which, combined with resistor 244, form the inverter clamping means which is explained later. The primary winding 252 of transformer 250 is connected across the output leads of the inverter. The four IGBTs are alternately activated in diagonal pairs (IGBTs 240a, 240d and IGBTs 240b, 240c) by voltages applied to their control leads such that each output lead of the inverter is alternately connected to positive and negative buses 241a, 241b of the inverter circuit 218. A short overlap time of approximately two microseconds occurs at each polarity transition where all four IGBTs are conducting. A substantially square wave alternating current is developed through the primary 252 of the transformer 250.

Figure 3:
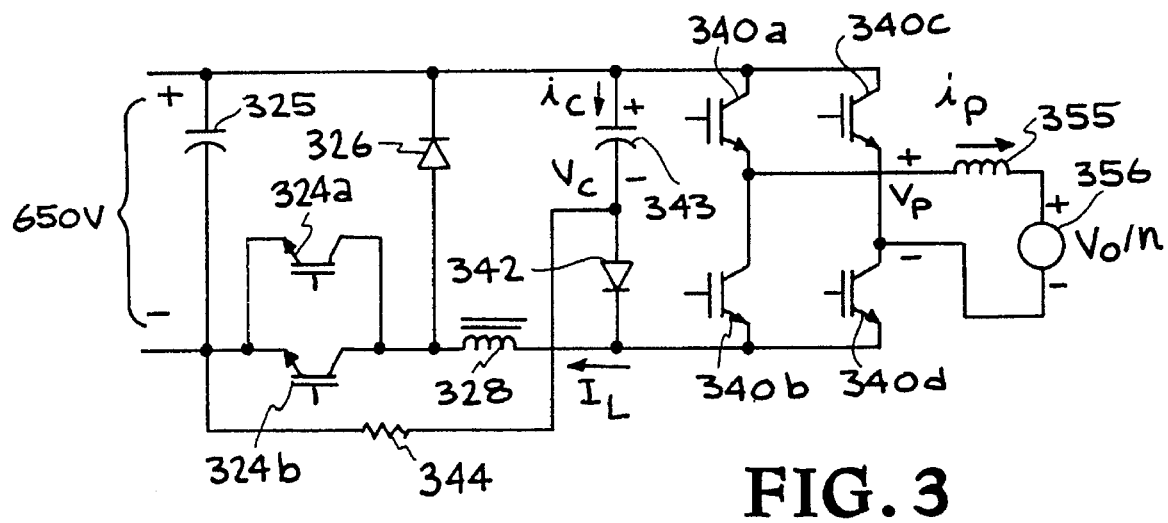
FIG. 3 is a partial circuit diagram of a single module with an equivalent representation of the transformer primary.

Referring to FIG. 3, the inverter clamping network formed by a 2 microfarad (μF) capacitor 343, diode 342, and 8 ohm resistor 344 functions to limit the voltage between the positive and negative buses which feed the inverter, and thereby limit the voltage across the IGBT switches, during change in polarity of the inverter output. FIG. 3 shows a portion of the inverter and regulator power circuit driving an equivalent representation of the step up transformer load. Inductor 355 represents the transformer leakage inductance and voltage source 356 represents the secondary voltage reflected to the primary. The magnitude of voltage source 356 is substantially equal to the magnitude of the module dc output voltage divided by the transformer turns ratio. The polarity of voltage source 356 is as shown in FIG. 3 when the direction of current $i_p$ is as indicated in FIG. 3. It changes to the opposite polarity when the current $i_p$ changes to the opposite direction.

Figure 4:
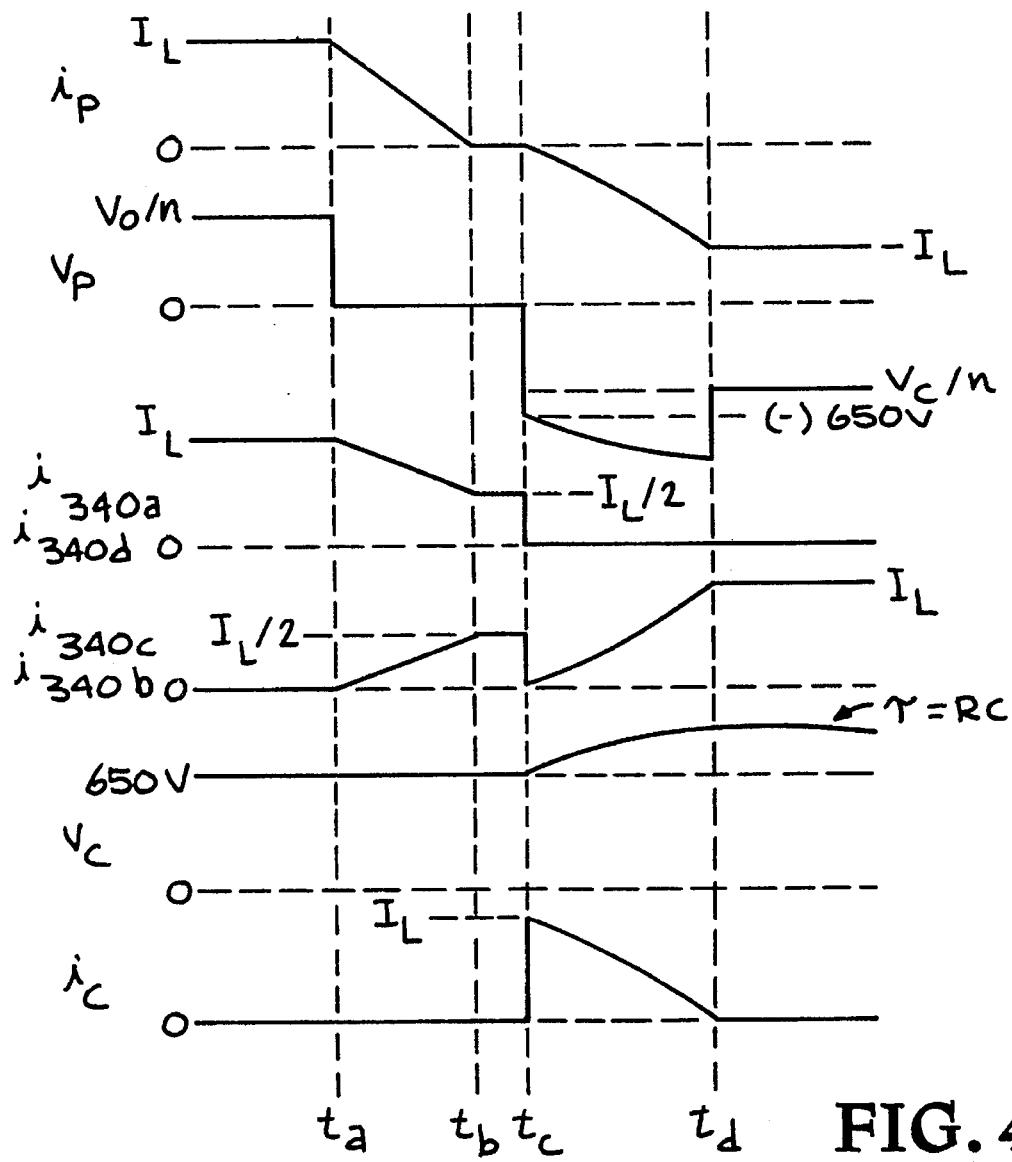
FIG. 4 is a timing diagram showing the operation and waveforms of the inverter clamping circuit.

The principles of the inverter clamping network are best described by referring to the waveforms during transition of polarity of the inverter output as shown in FIG. 4. For an inverter output frequency of 10 kHz, these waveforms occur every 100 microseconds during transition from positive to negative inverter output polarity. The same waveforms but of opposite polarity also occur every 100 microseconds during transition from negative to positive inverter output. The transitions are spaced 50 microseconds apart to create the substantially square current waveforms out of the inverter.

Referring to FIG. 4, prior to time $t_a$ IGBT switches 340a and 340d are on and conducting and transistors switches 340b and 340c are off and nonconducting. The current $I_L$ in inductor 328 flows through switches 340a and 340d and through the equivalent load formed by the inductor 355 and voltage source 356. At time $t_a$, switches 340b and 340c are also turned on which results in zero voltage across the equivalent load and the beginning of the decay of current $i_p$ to zero which occurs at time $t_b$. Between times $t_b$ and $t_c$, all four switches 340a, 340b, 340c, and 340d are conducting current of magnitude $I_L/2$. At time $t_c$, switches 340a and 340d are turned off and they become nonconducting. The current $I_L$ in inductor 328 is now forced to flow through the capacitor 343, which is precharged to 650 V through resistor 344, and diode 342. This applies–650 V across the equivalent load which results in the buildup of current $i_p$ in the negative direction. The voltage across capacitor 343 and the current $i_p$ through the equivalent load continue to increase until the magnitude of $i_p$ reaches the value $I_L$ at time $t_d$. At this time, $t_d$, the diode 342 becomes reverse biased and capacitor 343 begins discharging back to 650 V through resistor 344 in preparation for the next polarity transition one half cycle later.

It will be appreciated that an alternate current path is provided for current flow as current builds up from zero in the inductive load 355. A capacitor 343 is connected from one of the two input circuit lines and one lead of a voltage source capacitor 325 to a circuit node between a resistor 344 and diode 342, so that as current builds up from zero to a maximum value, excess current flow is from one of the two input circuit lines through the capacitor 343 and diode 342 to the other of the two input circuit lines. Voltage across the two circuit lines is clamped to approximately the voltage of the voltage source 325. This inverter clamping network consisting of capacitor 343, diode 342, and resistor 344 is superior to known prior art because the fast varying currents occur only within capacitor 343, diode 342, and the inverter IGBT switches 340a, 340b, 340c, and 340d. Capacitor 343 and diode 342 are located very close to the inverter IGBTs which minimizes the stray inductance of the loop formed by the capacitor, diode, and IGBTs. As a result, the voltage transient spikes appearing across the IGBTs, which are created by this inductance and the fast change of currents, are minimized.

Referring again to FIG. 2, the inverter circuit also includes a means for simultaneously turning on all of the IGBT switch means 240a-240d for shorting and thereby isolating the primary 252 of transformer 250 when an incipient gun arc is sensed. This minimizes the amount of power supply current which passes through the load during load arcs.

It will be apparent to those skilled in the art that snubber networks, each consisting of a resistor, diode, and capacitor, may be needed in conjunction with each IGBT in the voltage regulator 214 and inverter 218. These snubber networks are not shown in FIGS. 1, 2, and 3 for reasons of clarity. Designs of snubber networks for IGBTs are well known.

A one turn voltage sense winding 255 is wound on the same transformer core as primary 252 and secondary 254. Voltage sense winding 255 provides a means for sensing an ac voltage proportional to the ac voltage across the secondary 254 of transformer 250. The ac voltage induced in sense winding 255 is then rectified and filtered by an output simulator means 290. In addition, the output current of the module is sensed by the dc current sensor 280 and used to control a current source in parallel with the filter capacitor 293 in the output simulator 290. The current source represents the current source characteristic of an ion source, and specifically an electron beam gun. The capacitance value of filter capacitor 293 and the value and range of current source 292 are scaled so that the output of the output simulator 290 accurately represents the voltage level and circuit dynamics of the output of the dc—dc converter module and is consistent with the voltage levels used in the feedback control circuit. Implementation of the output simulator 290 is done with well known electronic circuit techniques. Use of the one turn sense winding 255 and the output simulator permit generation of the module output voltage feedback signal without requiring high voltage isolation circuitry which would be needed if the module output voltage was measured directly.

The output simulator 290 comprises a diode rectifier means 291 responsive to the ac voltage produced by the sense winding 255 to produce a dc voltage on two output lines. This dc voltage is proportional to the dc output voltage of the power supply module 112. The output simulator means 290 also includes a filter capacitor 293 connected across the two output lines from the rectifier means 291. A controlled current source means 292 is also connected across the two output lines for applying the output voltage of the current sensing means 280 to produce a current proportional to the output current of the power supply module. The controlled current source means 292 draws current out of the two output lines to create an accurate simulation of power supply module output voltage.

The output of the output simulator 290 is then applied to a voltage summing means 266. In the summing means, voltage from the output simulator 290 is subtracted from a set point voltage. The set point voltage is a reference voltage for controlling the amplitude of the dc—dc converter output voltage. The set point voltage enables the amplitude of the converter output voltage to be controlled to a desired level. The output of the voltage summing means 266 is a difference voltage, that is, the difference between the set point voltage and the voltage output simulator.

The difference voltage is amplified and filtered in accordance with known techniques in the compensator 268. The amplified voltage from the compensator 268 is then compared to a clock generated sawtooth voltage in a comparator 270. The sawtooth voltage is generated by a sawtooth generator means 272 and is synchronized to the clock pulse of the system. The output of the comparator is a logic level enable signal (+5V for example) which has an enable and a disable state. The output of the comparator 270 and the clock logic signal feed the regulator logic and driver circuit 274 which distributes the enable signal to the regulator IGBTs 224a and 224b. Logic and driver circuit 274 also provides the means for alternately enabling IGBTs 224a and 224b. This logic and driver circuit 274 is implemented using well known electronic techniques. The enable signal has a variable ratio of the time during which the voltage is high to the time during which the voltage is low as a function of the error voltage output of compensator 268. The enable signal is then applied to the enable leads of the IGBT switch means 224a and 224b of the voltage regulator circuit 214. This provides dynamic regulation of the dc voltage on the output of the power supply in accordance with varying loads being sensed by the output simulator 290 and sense winding 255.

In accordance with another aspect of the present power supply, a dc current sensor means 280 is provided on the negative output lead of the power supply. There, the sensed output current is compared with a predetermined threshold indicative of current conditions during an incipient gun arc. The sensed current and current threshold are compared in a voltage comparator 282. The voltage comparator produces an output signal when current above a predetermined threshold is sensed and an incipient gun arc is present. This in turn sends a signal to a cutback timer 284 which generates a pulse ranging from 50 ms to 200 ms and which in turn activates the inverter logic and driver circuit 286. When a gun arc is sensed, the inverter logic and driver circuit 286 simultaneously activates all four IGBTs 240a-240d which shorts out the primary 252 and thereby terminates current let through from the primary side to the load side. The cutback timer 284 also simultaneously sends a signal to the regulator logic and driver circuit 274 which turns off the regulator switch means 224a and 224b.

While the invention has been described in connection with what is presently considered to be the most practical and preferred embodiments, it is to be understood that the invention is not limited to the disclosed embodiment, but on the contrary, is intended to cover various modifications and equivalent arrangements included within the spirit and scope of the appended claims.

What is claimed is:

1. Circuit means for generating a ground level voltage feedback signal for controlling the output voltage of one of a plurality of dc—dc converter modules having their outputs connected in series to form a supply output lead, each module including a switching means for producing a pulsating voltage of controlled duty cycle, an inductor means for converting said pulsating voltage into a smooth direct current, an inverter means for producing from said direct current an alternating current through the primary of a transformer, said transformer having at least one secondary winding inductively coupled to said primary winding for producing an output voltage of said module, said circuit means for generating the output voltage feedback signal comprising:

a separate transformer winding inductively coupled with said primary and said secondary for producing an ac voltage whose magnitude is proportional to the dc output voltage of said dc—dc converter module;

rectifier means responsive to said ac voltage produced by said separate transformer winding having a connection with a capacitor for producing a dc voltage on two output lines which voltage is proportional to the dc output voltage of said dc—dc converter module;

current sensing means connected to said supply output lead for producing an output voltage proportional to the current flowing through the output of all of said series connected dc—dc converter modules;

controlled current source means connected across said two output lines for applying the output voltage of said current sensing means to produce a current proportional to the output current of said dc—dc converter module wherein said controlled current source means draws current out of said two output lines to create an accurate simulation of the module output load.

2. A circuit means for decoupling a power supply output from load generated arcs comprising:

a power supply including a plurality of dc—dc converter modules each having two input lines and two output lines, said modules linked in parallel on their input lines and in series on their output lines;

regulating means, provided in each module, for producing a controlled source of direct current;

inverter means for generating a square wave current of alternating polarity from said controlled source of direct current;

transformer means for stepping up an applied voltage and for stepping down said square wave current from said inverter means;

output rectifier and filter capacitor means for rectifying and filtering said square wave current from said transformer;

inductor means disposed in a power supply output line for limiting current rate of change between said plurality of said series connected output lines of said dc—dc converter modules and a supply output line;

resistor damping means connected in parallel with said inductor means, said resistor damping means for reducing oscillation caused by resonance between said inductor and said filter capacitor.

3. An apparatus according to claim 2 wherein said inductor means for limiting current rate of change and said resistor damping means for reducing oscillation, connected in parallel with said inductor means, are inserted in each output line of said plurality of dc—dc converter modules.

4. An apparatus according to claim 3 wherein said plurality of dc—dc converter modules have their output lines connected in parallel.

5. A power supply for producing a controlled high voltage output when operating with rapidly changing loads such as when load arcing is present comprising;

a means for rectifying a source of multiphase ac voltage and for producing an unregulated dc voltage on positive and negative out leads;

a plurality of dc—dc converter modules connected in parallel across said positive and negative dc output leads of said means for rectifying, each of said converter modules including a regulator means for producing a pulsating voltage of controlled duty cycle, an inductor means for smoothing said pulsating voltage into a smooth direct current, inverter switch means for converting said direct current into high frequency square wave current of alternating polarity, transformer means having a primary winding for receiving said high frequency square wave current and for stepping up the applied voltage across said primary winding to a high voltage level across a secondary winding, output rectifier and filter capacitor means for converting the high frequency, high voltage developed across said secondary into a high direct voltage on a positive and negative output lead of a first output rectifier and filter of a first dc—dc converter module connects to the negative output lead of a second output rectifier and filter of a second circuit module such that the dc output voltage produced by all circuit modules are added and the sum of said voltage is developed across a positive and negative output line of the power supply;

output simulator means including a voltage sense winding means inductively coupled with each primary and secondary winding of said transformers in said plurality of dc—dc converter modules and for producing a simulated output voltage proportional to the dc—dc converter module output voltage; and control means for activating each successive dc—dc converter module in a phased relationship, 360°/n out of phase with an adjacent dc—dc converter module, where n is the number of dc—dc converter modules in said plurality of dc—dc converter modules, and for sensing in each of said dc—dc converter modules said simulated voltage and including means for regulating said dc voltage as a function of the difference between said simulated voltage and a desired output voltage.

6. A power supply according to claim 5 wherein said plurality of dc—dc converter modules each have their respective output leads connected in parallel.

7. A power supply according to claim 5 wherein each of said plurality of dc—dc converter modules further comprises:

a regulator switching means having a collector lead, a control lead and an emitter wherein said emitter is connected to said negative dc output of said rectifier, said collector is connected to the anode of a free wheeling diode and to a first lead of an inductor;

an inverter means having first and second input leads wherein said first input lead connects to a second input lead of said inductor and said second input lead connects to said free wheeling diode cathode and to the positive dc output lead of said rectifier;

control means for sequentially enabling successive regulator switch means of each successive converter module equally out of phase with an adjacent converter module.

* * * * *